United States Patent
Hu (10) Patent No.: US 10,833,253 B2
(45) Date of Patent: Nov. 10, 2020

(54) LOW MAGNETIC MOMENT MATERIALS FOR SPIN TRANSFER TORQUE MAGNETORESISTIVE RANDOM ACCESS MEMORY DEVICES

(71) Applicant: INTERNATIONAL BUSINESS MACHINES CORPORATION, Armonk, NY (US)

(72) Inventor: Guohan Hu, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/017,001

(22) Filed: Feb. 5, 2016

(65) Prior Publication Data

US 2017/0229642 A1    Aug. 10, 2017

(51) Int. Cl.
| H01L 29/82 | (2006.01) |
| H01L 43/10 | (2006.01) |
| H01L 27/22 | (2006.01) |
| H01L 43/02 | (2006.01) |
| H01L 43/12 | (2006.01) |

(52) U.S. Cl.
CPC ............ *H01L 43/10* (2013.01); *H01L 27/222* (2013.01); *H01L 43/02* (2013.01); *H01L 43/12* (2013.01)

(58) Field of Classification Search
CPC ......... H01L 43/10; H01L 43/02; H01L 43/12; H01L 27/222
See application file for complete search history.

(56) References Cited

U.S. PATENT DOCUMENTS

| 7,242,045 B2 * | 7/2007 | Nguyen ................ B82Y 25/00 257/204 |
| 7,256,971 B2 | 8/2007 | Horng et al. |
| 7,280,389 B2 | 10/2007 | Guo |
| 7,378,716 B2 | 5/2008 | Kim et al. |
| 7,430,135 B2 | 9/2008 | Huai et al. |
| 7,538,402 B2 | 5/2009 | Fukumoto |
| 8,472,151 B2 | 6/2013 | Wang et al. |
| 8,546,896 B2 | 10/2013 | Lottis et al. |
| 8,592,927 B2 | 11/2013 | Jan et al. |

(Continued)

FOREIGN PATENT DOCUMENTS

| CN | 101133476 | 2/2008 |
| CN | 103109322 | 5/2013 |

OTHER PUBLICATIONS

List of IBM Patents or Patent Applications Treated as Related dated May 20, 2016, 2 pages.

(Continued)

*Primary Examiner* — Stephen M Bradley
*Assistant Examiner* — Wasiul Haider
(74) *Attorney, Agent, or Firm* — Tutunjian & Bitetto, P.C.; Rabin Bhattacharya (57) ABSTRACT

A magnetoresistive random access memory device (MRAM) device is described. The MRAM device has a stack arrangement in which a tunnel barrier layer is formed over a magnetizable reference layer, a metal layer is formed over the tunnel barrier layer, a free layer of a magnetizable material is formed over the metal layer, and an oxide layer is formed over the free layer as a cap layer. The resulting MRAM device has a thin free layer that exhibits a low magnetic moment.

20 Claims, 8 Drawing Sheets

(56) References Cited

U.S. PATENT DOCUMENTS

| | | | |
|---|---|---|---|
| 8,698,260 B2 | 4/2014 | Jan et al. | |
| 8,836,061 B2 | 9/2014 | Zhou et al. | |
| 8,913,423 B2 | 12/2014 | Lee et al. | |
| 8,928,100 B2 | 1/2015 | Gaidis et al. | |
| 9,040,178 B2 | 5/2015 | Zhao et al. | |
| 9,082,963 B2 | 7/2015 | Gaidis et al. | |
| 9,105,340 B2 | 8/2015 | Lee et al. | |
| 9,196,332 B2 | 11/2015 | Zhang et al. | |
| 2002/0191451 A1* | 12/2002 | Kishi | G11C 11/161 365/200 |
| 2005/0174834 A1 | 8/2005 | Kim et al. | |
| 2007/0111332 A1* | 5/2007 | Zhao | B82Y 10/00 438/3 |
| 2010/0096716 A1* | 4/2010 | Ranjan | B82Y 10/00 257/421 |
| 2012/0181537 A1* | 7/2012 | Cao | H01L 43/00 257/53 |
| 2012/0326250 A1* | 12/2012 | Gaidis | H01F 10/3254 257/421 |
| 2013/0119495 A1 | 5/2013 | Vetro et al. | |
| 2015/0087080 A1 | 3/2015 | Gaidis et al. | |
| 2015/0207064 A1* | 7/2015 | Lee | H01L 43/12 438/3 |
| 2015/0236252 A1 | 8/2015 | Gaidis et al. | |
| 2015/0311431 A1* | 10/2015 | Zhou | H01L 43/08 257/421 |
| 2015/0333254 A1* | 11/2015 | Liu | G01R 33/096 438/3 |
| 2016/0072049 A1 | 3/2016 | Noma | |
| 2016/0081508 A1* | 3/2016 | Wong | A47G 33/06 362/123 |
| 2016/0181508 A1* | 6/2016 | Lee | H01L 43/02 257/421 |
| 2016/0260771 A1* | 9/2016 | Fukuzawa | H01L 43/08 |
| 2018/0166628 A1* | 6/2018 | Kim | H01L 43/10 |
| 2018/0331280 A1* | 11/2018 | Hosoya | C23C 14/185 |
| 2018/0350418 A1* | 12/2018 | Doyle | H01L 43/08 |
| 2019/0148626 A1* | 5/2019 | Honma | H01L 43/08 257/421 |

OTHER PUBLICATIONS

U.S. Office Action issued in U.S. Appl. No. 15/094,052 dated Jun. 20, 2017, 10 pages.

U.S. Office Action issued in U.S. Appl. No. 15/094,052 dated Mar. 7, 2017, 11 pages.

* cited by examiner

LOW MAGNETIC MOMENT MATERIALS FOR SPIN TRANSFER TORQUE MAGNETORESISTIVE RANDOM ACCESS MEMORY DEVICES

BACKGROUND

Technical Field

The present invention relates to spin torque transfer (STT) magnetoresistive random access memory (MRAM) devices, and more particularly to STT MRAM devices that exhibit a reduced free layer moment of the device, which reduces the device switching current.

Description of the Related Art

MRAM devices store data through magnetic elements. A MRAM device may employ two magnetic elements separated from each other by a barrier layer. One of the magnetic elements can be a permanent magnet set to a fixed polarity, and the polarity of the other magnetic element is adaptable to store data. The different digital states (i.e. one or zero) can be differentiated by assessing whether the polarity of the two elements are the same or different. Data can be read by measuring the electrical resistance of the cell. For example, a transistor can switch a current through the cell such that charge carriers tunnel through the barrier in accordance with the tunnel magneto resistance effect. The resistance of the cell is dependent on the alignment of the magnetic moments of the two elements. Writing data to an MRAM can be conducted using a variety of methods. Spin transfer torque (STT), which employs a spin polarized current, is one such method, and is employed in STT MRAM devices.

In a STT MRAM devices, the spin-polarized current is altered as it passes through the adaptable magnetic element, which applies a torque to the magnetic element and changes its polarity. One of the challenges facing designers of STT MRAM devices is the large switching current required to effect fast switching.

SUMMARY

In one embodiment according to the present principles, described is a magnetoresistive random access memory device having a reference layer of a magnetic material having a fixed magnetic polarity. A tunnel barrier layer is formed over the reference layer. A layer of metal formed over the tunnel barrier layer, and a free layer of a magnetic material having a changeable magnetic polarity is formed over the metal layer. A cap layer is formed over the free layer.

According to another embodiment of the present principles, described is a method for forming a magnetoresistive random access memory device. A tunnel barrier layer is formed over a reference layer that is comprised of a magnetic material with a fixed magnetic polarity. A metal layer is formed over the tunnel barrier layer. A free layer of a magnetic material having a changeable magnetic polarity is formed over the metal layer. A cap layer is formed over the free layer; and the device structure is annealed.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein.

DETAILED DESCRIPTION OF PREFERRED EMBODIMENTS

Detailed embodiments according to the embodiments of the present principles and methods are disclosed herein; however, it is to be understood that the disclosed embodiments are merely illustrative of the structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

As used herein, the term "memory device" means a structure in which the electrical state can be altered and then retained in the altered state. In this way, a bit of information can be stored. Spin torque transfer magnetoresistive random access memory (STT MRAM) uses magnetic materials as the memory storage element. In some examples, STT MRAM uses memory storage elements that take advantage of the reversal of the magnetic polarity when a current passes through a magnetic material, such as a magnetic tunnel junction (MTJ). Passing a current through a MTJ causes the direction of magnetization to switch between a parallel or anti-parallel state, which has the effect of switching between low resistance and high resistance. Because this effect can be used to represent the 1 s and 0 s of digital information, STT MRAM can be used as a non-volatile memory.

Reading STT MRAM involves applying a voltage to the MTJ to discover whether the MTJ offers high resistance to current ("1") or low resistance ("0"). In an embodiment, a MTJ stack includes reference layer(s) (also referred to as pinned layer(s)), tunnel layer(s) and free layer(s). A MTJ stack may be arranged with the reference layer and the tunnel barrier being disposed beneath the free layer.

Exemplary materials for the free layer(s) include alloys and/or multilayers of cobalt (Co), iron (Fe), alloy of cobalt-iron (CoFe), nickel (Ni), alloy of nickel-iron (NiFe) and alloy of cobalt-iron-boron (CoFeB). The reference layer may be a single layer region that is constructed of a metal or metal alloy that is comprised of one or more metals that exhibit high spin polarization. Exemplary metals include iron (Fe), nickel (Ni), cobalt (Co), chromium (Cr), boron (B), manganese (Mn), platinum (Pt), palladium (Pd), ruthenium (Ru), tantalum (Ta), tungsten (W), and/or copper (Cu). Exemplary metal alloys may be comprised of metals exemplified by the above, e.g., Fe, Ni, Co, Cr, B, Mn, Pt, Pd, Ru, Ta, W and Cu. In another embodiment, the reference layer may be a multilayer arrangement comprising (1) a high spin polarization region comprised of a metal and/or metal alloy of Fe, Ni, Co, Cr, B, Mn, Pt, Pd, Ru, Ta, W and/or Cu (the metals mentioned above), and (2) a region constructed of a material or materials that exhibit strong perpendicular magnetic anisotropy (strong PMA). Such a material may be a metal exemplified by cobalt (Co), nickel (Ni), platinum (Pt), palladium (Pd), iridium (Jr), ruthenium (Ru), and may be arranged as alternating layers. The strong PMA region may also be comprised of alloys that exhibit strong PMA, such alloys being exemplified by cobalt-iron-terbium (CoFeTb), cobalt-iron-gadolinium (CoFeGd), cobalt-chromium platinum (CoCrPt), cobalt-platinum (CoPt), cobalt-palladium (CoPd), iron-platinum (FePt) and/or iron-palladium (FePd), and may be arranged as alternating layers. In one embodiment, combinations of these materials and regions may also be employed.

In another embodiment, a spacer layer may be formed between the metal/metal alloy region and the strong perpendicular magnetic anisotropy region. The spacer layer may be formed of a metal exemplified by tungsten (W), tantalum (Ta), copper (Cu) and combinations thereof.

The tunnel barrier layer(s) can be composed of magnesium oxide (MgO), aluminum oxide ($Al_2O_3$) and titanium oxide ($TiO_2$), or materials of higher electrical tunnel conductance, such as semiconductors or low-bandgap insulators.

A STT MRAM uses a 2 terminal device with including, among other possible layers, a pinned layer, a tunnel barrier layer, and a free layer in a magnetic tunnel junction stack. The magnetization of the pinned layer is fixed in direction (for example, pointing up) and a current passed down through the junction makes the free layer parallel to the pinned layer, while a current passed up through the junction makes the free layer anti-parallel to the pinned layer. A smaller current (of either polarity) is used to read the resistance of the device, which depends on the relative orientations of the magnetizations of the free and pinned layers. The resistance is typically higher when the magnetizations are anti-parallel, and lower when they are parallel (though this can be reversed, depending on the material).

In one embodiment, an alloy of cobalt iron boride (CoFeB) is used as the free layer material for STT-MRAM devices. In one other embodiment, the free layer, e.g., the cobalt-iron-boride (CoFeB) free layer, interfaces with an oxide layer on one free layer side and interfaces with a metal layer on another free layer side. In one embodiment, the oxide layer on the one free layer side is an oxide cap layer, positioned over the free layer. In one embodiment, the oxide cap layer is positioned directly over the free layer. In one embodiment, the metal layer is positioned under on the free layer side, and in another embodiment, the metal layer is positioned directly under the free layer side.

With regard to the interface between the free layer and the oxide cap layer, perpendicular magnetic anisotropy (PMA) performance is generated at the oxide interface. The oxide layer cap layer can be one or more different kinds of oxides, e.g., metal oxides, e.g., oxides of aluminum ($AlO_x$), oxides of magnesium ($MgO_x$), oxides of magnesium and titanium ($MgTiO_x$), oxides of magnesium and tantalum ($MgTaO_x$), oxides of titanium ($TiO_x$), oxides of tantalum ($TaO_x$), oxides of tungsten ($WO_x$), oxides of iridium ($IrO_x$) and oxides of ruthenium ($RuO_x$), among others. In one embodiment, the thickness of the oxide cap layer may be about 2 Å to 20 Å.

According to the embodiments of the present principles, the described MRAM devices exhibit improved free layer moments, e.g., free layer moments that are reduced by a factor of 2 and which retain good magnetic exchange coupling. In some embodiments, the method includes forming a CoFeB alloy based magnetic layer free layer bounded on upper and lower sides by an oxide cap layer and a metal layer. As will be described in greater detail below, some metals suitable for use in the metal layer can include aluminum (Al), magnesium (Mg), titanium (Ti), calcium (Ca), vanadium (V) and alloys thereof.

In STT MRAM devices, a large current is needed to carry out fast switching. In fast switching regimes, e.g., ≤10 ns, the overdrive current, which is the difference between the switching current I at a certain pulse width and the critical current $I_c$ is inversely proportional to the write pulse, as shown below:

$$\eta \frac{I - I_c}{e} t_p \propto \frac{m}{\mu_B}$$

where ($I-I_c$) is the overdrive, $\eta$ is the spin polarization of the magnetic materials, $t_p$ is pulse width, m is the total moment of the free layer and $\mu_B$ is the Bohr magneton, which is a constant, and e is the electron charge. This equation suggests that reducing the free layer moment could result in a minimized switching current at a certain pulse width. Another advantage that flows from low free layer moment is that the deep bit write error rate (WER) performance of the device is improved.

The MRAM device according to an embodiment of the present principles provides for reducing the free layer moment by thinning the free layer, e.g., by reducing the thickness of the free layer. In one embodiment, the free layer thickness is reduced from about 15 Å to 20 Å to about 7 Å to 8 Å. Through the reduction in the moment of the free layer due to reducing free layer thickness, the switching current required to change the magnetic polarity of the free layer can be reduced. The MRAM device thus exhibits improved operating efficiency.

Figure 1:
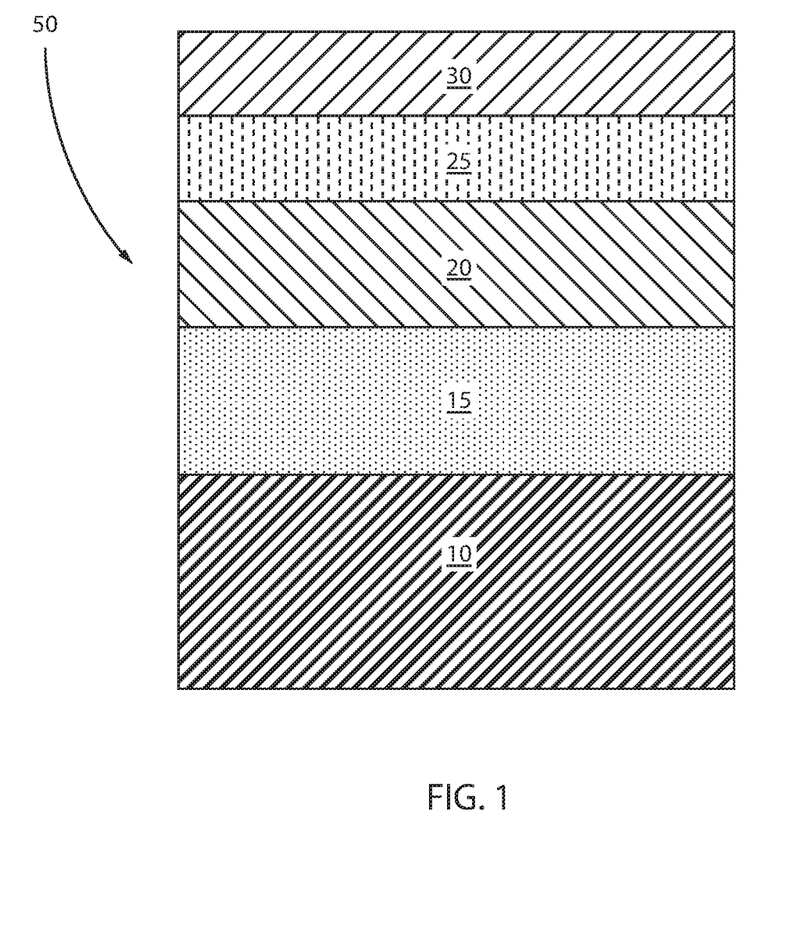
FIG. 1 is a side cross-sectional view of an MRAM device in accordance with an embodiment of the present principles, showing the device in a finished state in which among other features, a free layer is disposed between an oxide cap layer and a metal layer.

FIG. 1 depicts an embodiment of a STT MRAM device 50 in a finished form. In the depicted embodiment of FIG. 1, the device 50 includes, from top to bottom, an oxide cap layer 30, a free layer 25, a metal layer 20, a tunnel barrier layer 15, and a reference layer 10. It should be understood that other arrangements are possible, e.g., reordering certain stack components, or interposing additional stack component layers among those identified herein.

Figure 2:
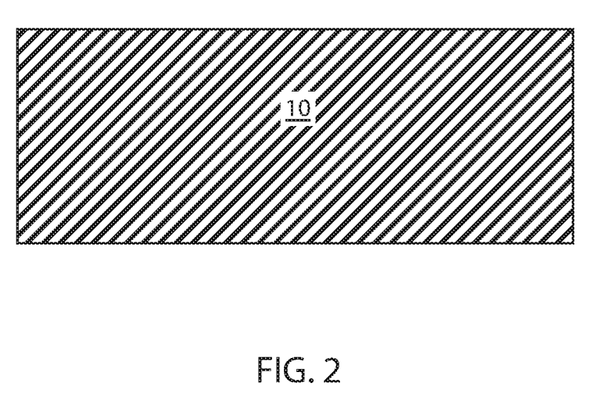
FIG. 2 is a side cross-sectional view of an MRAM device in accordance with an embodiment of the present principles depicting the device at an early stage of fabrication.

FIG. 2 shows the formation of an MRAM device in accordance with an embodiment of the present principles at a stage when reference layer 10 is formed. In one embodiment, the reference layer 10 is a single layer region that is constructed of a metal or metal alloy comprised of one or more metals that exhibit high spin polarization. Exemplary metals include iron (Fe), nickel (Ni), cobalt (Co), chromium (Cr), boron (B), manganese (Mn), platinum (Pt), palladium (Pd), ruthenium (Ru), tantalum (Ta), tungsten (W), and/or copper (Cu). Exemplary metal alloys may be comprised of metals exemplified by the above, e.g., Fe, Ni, Co, Cr, B, Mn, Pt, Pd, Ru, Ta, W and Cu. In another embodiment, the reference layer 10 may be a multilayer arrangement comprising (1) a high spin polarization region comprised of a metal and/or metal alloy of Fe, Ni, Co, Cr, B, Mn, Pt, Pd, Ru, Ta, W and/or Cu (the metals mentioned above), and (2) a region constructed of a material or materials that exhibit strong perpendicular magnetic anisotropy (PMA). Such a material may be a metal exemplified by cobalt (Co), nickel (Ni), platinum (Pt), palladium (Pd), iridium (Jr), ruthenium (Ru), and may be arranged as alternating layers. The PMA region may also be comprised of alloys that exhibit strong PMA, such alloys being exemplified by cobalt-iron-terbium (CoFeTb), cobalt-iron-gadolinium (CoFeGd), cobalt-chromium platinum (CoCrPt), cobalt-platinum (CoPt), cobalt-palladium (CoPd), iron-platinum (FePt) and/or iron-palladium (FePd), and may be arranged as alternating layers. In one embodiment, combinations of these materials and regions may also be employed.

In another embodiment, a spacer layer may be formed between the metal/metal alloy region and the strong perpendicular magnetic anisotropy region. The spacer layer may be formed of a metal exemplified by tungsten (W), tantalum (Ta), copper (Cu) and combinations thereof. The inclusion of the spacer layer may promote favorable crystal growth of the metal/metal alloy layer formed on the spacer layer, e.g., a body center cubic (bcc) crystalline structure may be formed with (001) orientation.

In some embodiments, the reference layer 10 may have a thickness ranging from 15 Å to 200 Å. The reference layer 10 may be formed on an electrically conductive electrode (not shown), or may be present on a substrate. The reference layer 10 can be formed using a deposition method, such as physical vapor deposition (PVD), e.g., plating, electroless plating, electroplating, sputtering (e.g., DC sputtering) and combinations thereof. In other embodiments, the reference layer 10 may be deposited using chemical vapor deposition (CVD).

Figure 3:
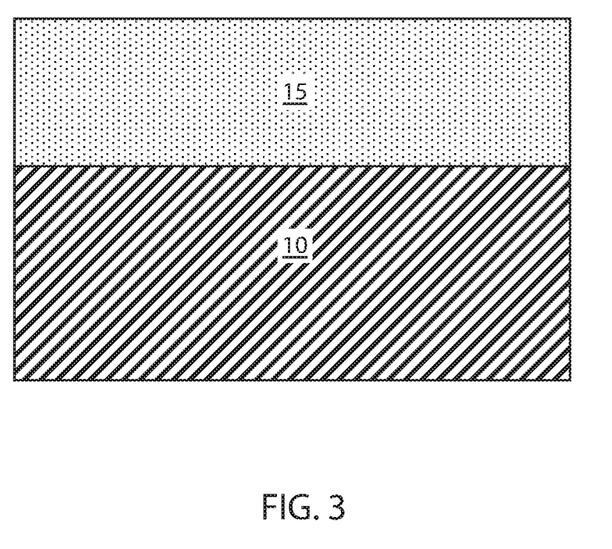
FIG. 3 is a side cross-sectional view of an MRAM device in accordance with an embodiment of the present principles depicting the device at a stage of fabrication in which a tunnel barrier layer has been deposited on the reference layer.

Referring to FIG. 3, tunnel barrier layer 15 is deposited on the reference layer 10. In one embodiment, the tunnel barrier layer 15 is composed of one or more metal oxides. For example, the metal oxides may be magnesium oxide (MgO), aluminum oxide ($Al_2O_3$) and titanium oxide ($TiO_2$). In one particular embodiment, the metal oxide of the tunnel barrier layer is MgO. The MgO tunnel barrier layer may be formed, for example, by depositing MgO by RF sputtering employing a MgO target or by depositing a Mg layer and then oxidizing same, e.g., by natural oxidation or radical oxidation. The tunnel barrier layer 15 has a thickness that promotes tunneling. The tunnel barrier layer 15, in combination with the reference layer 10, may produce a spin torque that can change the direction of magnetization in the free layer 25, with changes in the magnetization direction of the free layer being one mechanism that can provide the memory functions of a STT MRAM. The tunnel barrier layer 15 may have a thickness ranging from about 5 Å to about 20 Å.

Figure 4:
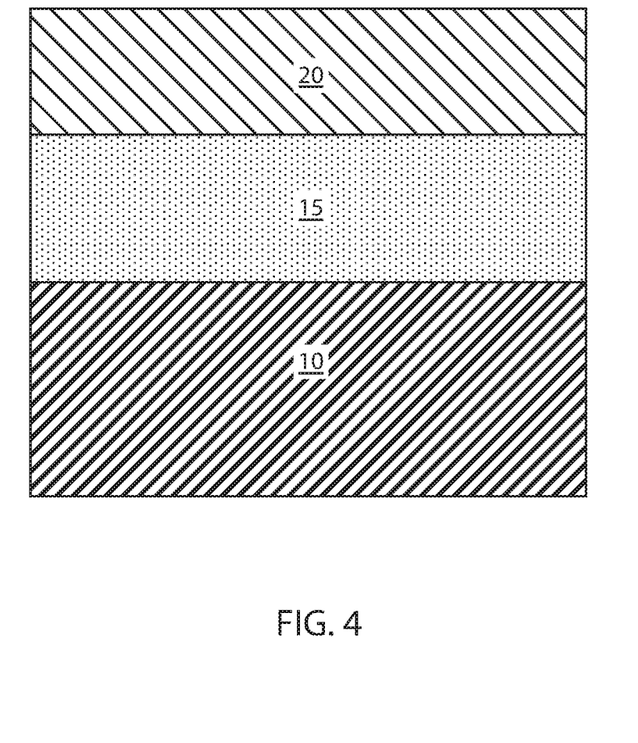
FIG. 4 is a side cross-sectional view of an MRAM device in accordance with an embodiment of the present principles depicting the device at a stage of fabrication in which a metal layer has been deposited on the tunnel barrier layer.

Referring to FIG. 4, metal layer 20 is deposited on the tunnel barrier layer 15, interposing the tunnel barrier layer 15 between the metal layer 20 and the reference layer 10. The metal layer 20 may be composed of one or metals, including alkaline earth metals, e.g., magnesium (Mg) and calcium (Ca), transition metals, e.g., titanium, (Ti), and vanadium (V), and post-transition metals, e.g., aluminum (Al). The one or more metals may be arranged as layers or may be in the form of an alloy of one or more of the metals. Metal layer 20 may have a thickness in the range of about 1 Å to 10 Å.

Metal layer 20 may be formed by sputtering a metal layer over the tunnel barrier layer, for example, by DC sputtering. The presence of the metal layer 20 may provide for the beneficial reduction in the thickness of the free layer that is formed over the metal layer. For example, in growing a free layer directly over a tunnel barrier layer, the metals used to form the free layer may exhibit higher surface energy than the materials used in the underlying tunnel barrier layer, e.g., MgO. The disparity in surface energies between the free layer materials and the tunnel barrier materials may promote the growth of the free layer in a non-uniform manner. For example, as the free layer grows over the tunnel barrier layer, the free layer may form island formations that cover the tunnel barrier layer unevenly. The amount of coverage of the free layer over the tunnel barrier layer may vary over the surface of the tunnel barrier layer. Free layer growth may be non-uniform, having discreet island formations of free layer material of varying thicknesses. The islands of free layer formation may be separated by bare spots, e.g., portions of the surface of the tunnel barrier layer that have no free layer coverage at all.

The non-uniformity of free layer formation may be overcome when the free layer material has been deposited to a particular thickness. At this point, a free layer of uniform thickness that uniformly covers the surface of the tunnel barrier layer may be attained. In some instances, uniformity is attained when free layer material coverage is about 15-20 Å thick. However, a free layer material that is about 15-20 Å thick exhibits a relatively high free layer moment, which would require a relatively large switching current to switch the polarity of the free layer.

Figure 5:
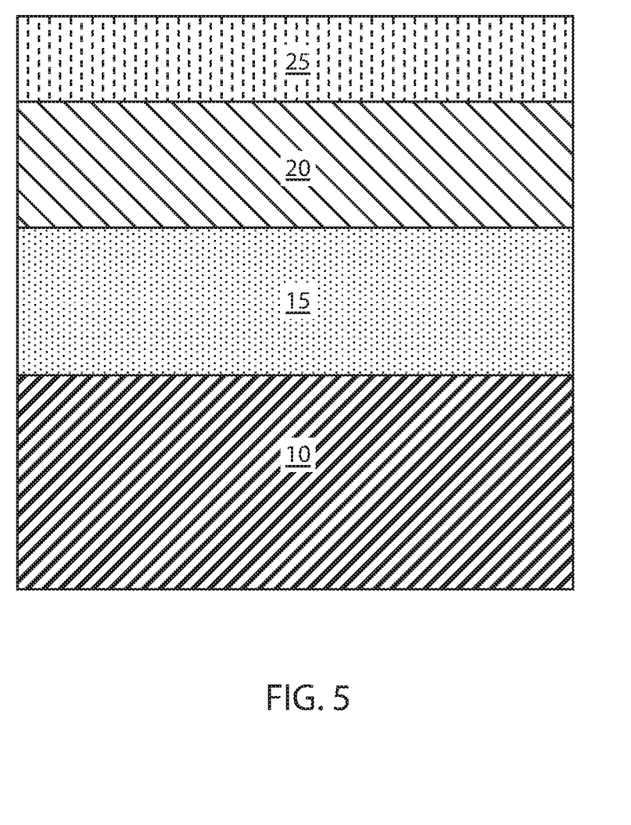
FIG. 5 is a side cross-sectional view of an MRAM device in accordance with an embodiment of the present principles depicting the device at a stage of fabrication in which a free layer has been deposited on the metal layer.

According to an embodiment of the present principles, and referring to FIGS. 1 and 5, a metal layer 20 is interposed between the tunnel barrier layer 15 and the free layer 25 in the MRAM device 50. The surface of the metal layer allows for free layer formation in a uniform manner at a thickness substantially less than if the free layer was formed directly on the tunnel barrier layer. In one embodiment, the thickness of the free layer formed over the metal layer is in the range of about 7 Å to about 10 Å. In one particular embodiment, the free layer thickness is about 8 Å. The magnetic moment of the free layer is reduced due to the reduction in free layer thickness. As a result, the switching current required to change the polarity of the free layer is reduced.

Referring to FIG. 5, free layer 25 is deposited over the metal layer 20. Free layer 25 includes one or more metals or alloys thereof. For example, the composition of free layer 25 may be cobalt (Co), iron (Fe), an alloy of cobalt-iron (CoFe), nickel (Ni), an alloy of nickel-iron (NiFe) and/or an alloy of cobalt-iron-boron (CoFeB). In one embodiment, the free layer 25 is composed of CoFeB, e.g., an alloy of cobalt (Co), iron (Fe) and boron (B). In one embodiment, the free layer may have the composition of $Co_{60}Fe_{20}B_{20}$, yet this given as only one example of a particular CoFeB alloy composition that can used as the free layer 25.

The free layer 25 may have a magnetic direction that can be switched in a manner that can provide a memory mechanism for STT MRAMs. Alloys with other amounts and proportions of Co, Fe and B are also suited for composing the free layer 20. Prior to annealing, the amount of B in a CoFeB alloy in the free layer 25 can be greater than 15 at. %. For example, the boron content may range from 15 at. % to 60 at. % in the free layer that is composed of the alloy of cobalt (Co), iron (Fe), and boron (B) prior to annealing. In other examples, the boron content may range from 20 at. % to 50 at. % in the free layer that is composed of the alloy of cobalt (Co), iron (Fe), and boron (B) prior to the annealing process.

The free layer 25 may be formed using a deposition process, such as physical vapor deposition (PVD), which can include sputtering (e.g., DC sputtering, plasma enhanced chemical vapor deposition (PECVD), metal organic chemical vapor deposition (MOCVD) and combinations thereof. The free layer 25 may have a thickness ranging from about 7 Å to about 10 Å. In another embodiment, the free layer 25 may have a thickness of about 8 Å. As described above in accordance with an embodiment of the present principles, the free layer thickness is reduced substantially by forming same over a metal layer, as opposed to forming same over the tunnel barrier layer.

Referring to FIG. 1, an oxide cap layer 30 is formed over the free layer 25. The composition of oxide cap layer 30 may be one or more metal oxides, e.g., oxides of aluminum ($AlO_x$), oxides of magnesium ($MgO_x$), oxides of magnesium and titanium ($MgTiO_x$), oxides of magnesium and tantalum ($MgTaO_x$), oxides of titanium ($TiO_x$), oxides of tantalum ($TaO_x$), oxides of tungsten ($WO_x$), oxides of iridium ($IrO_x$) and oxides of ruthenium ($RuO_x$), among others. The oxide cap layer may have a thickness in the range of about 2 Å to about 15 Å. The oxide cap layer may be formed by a deposition technique such as RF sputtering, which employs a metal oxide target, or by depositing a metal layer and then oxidizing same, e.g., by thermal oxidation. At the interface between the free layer and the oxide cap layer, perpendicular magnetic anisotropy (PMA) may be generated.

Following the deposition of the top layer of the stack, e.g., the oxide cap layer 30, the device is subjected to an annealing process. In some embodiments, the annealing may occur at a temperature ranging from about 300° C. to about 400° C. Annealing can occur for a time period ranging from about 5 minutes to about 90 minutes. In some embodiments, the annealing process time may range from about 10 minutes to about 60 minutes. The above examples of anneal time are provided for illustrative purposes. For example, the anneal time may be modified in view of the selected anneal temperature.

Figure 6A:
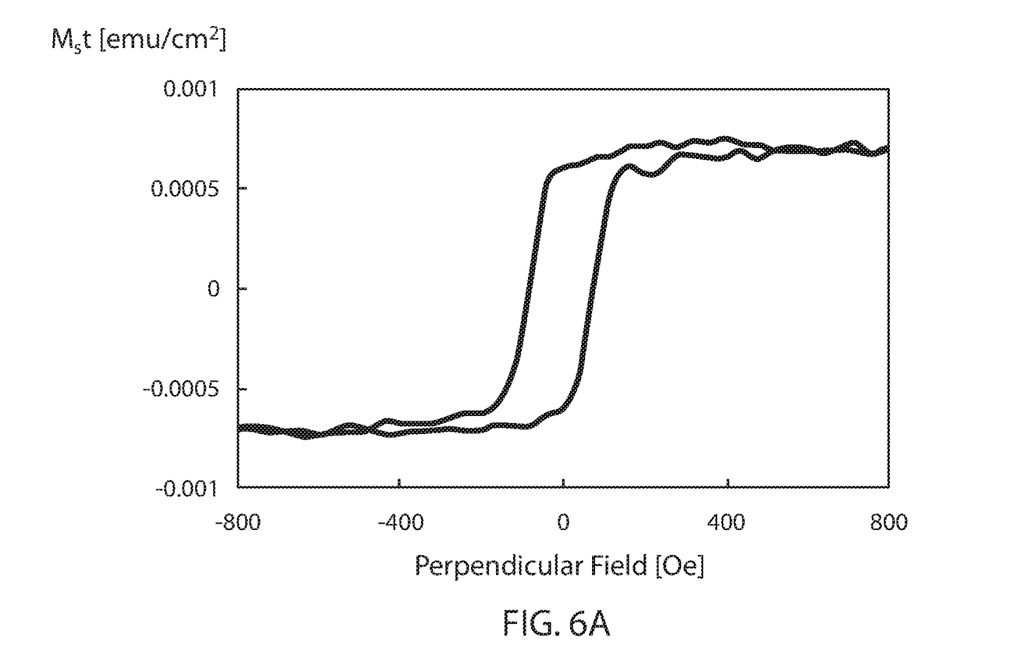
FIG. 6A is a plot of magnetization (y-axis) vs. applied magnetic field (x-axis) for the free layer of a MRAM device in accordance with an embodiment of the present principles, in which the magnetic field is applied perpendicular to the plane of the film.
Figure 6B:
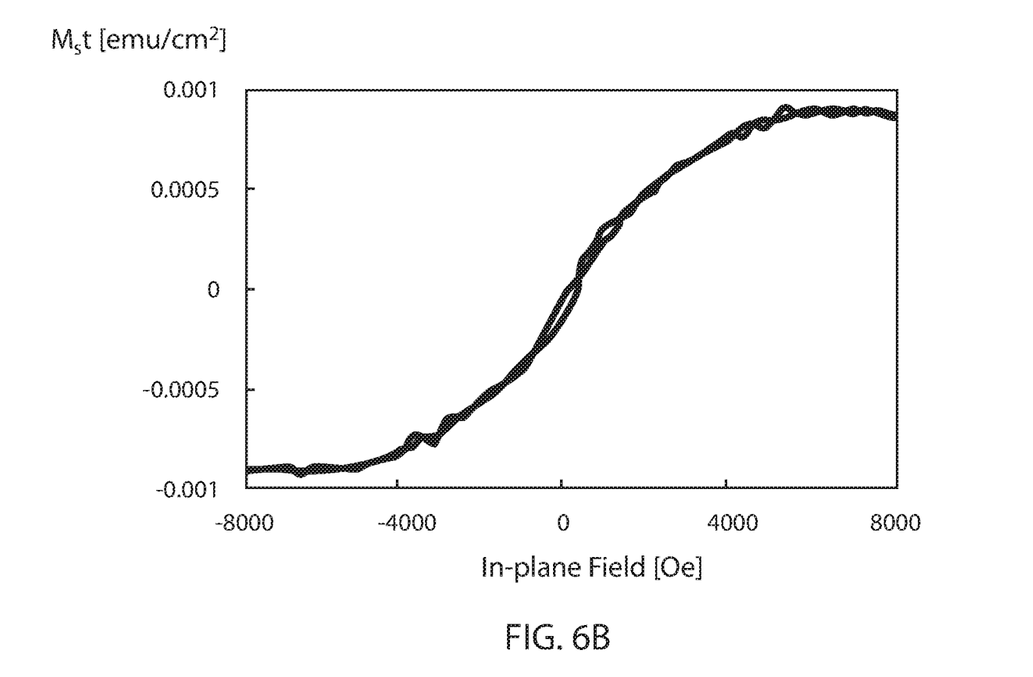
FIG. 6B is a plot of magnetization (y-axis) vs. applied magnetic field (x-axis) for the free layer of a MRAM device in accordance with an embodiment of the present principles, in which the magnetic field is applied parallel to the plane of the film.

FIGS. 6A and 6B are plots are magnetization of an about 8 Å thick free layer (y-axis) vs. the magnetic field (x axis). FIG. 6A shows the magnetization vs. a magnetic field applied perpendicularly (e.g., the field is applied perpendicular to the film plane). FIG. 6B shows magnetization vs an in-plane field (e.g., the field is applied parallel to the film plane). As shown in FIG. 6A, the magnetization vs field loop is sharp, which is an indication of a strong magnetic coupling in the film. FIG. 6B shows that the 8 Å thick film exhibits a strong perpendicular magnetic anisotropy. In one exemplary embodiment, strong PMA may be regarded as an anisotropy field that exceeds 3000 Oe.

Figure 7:
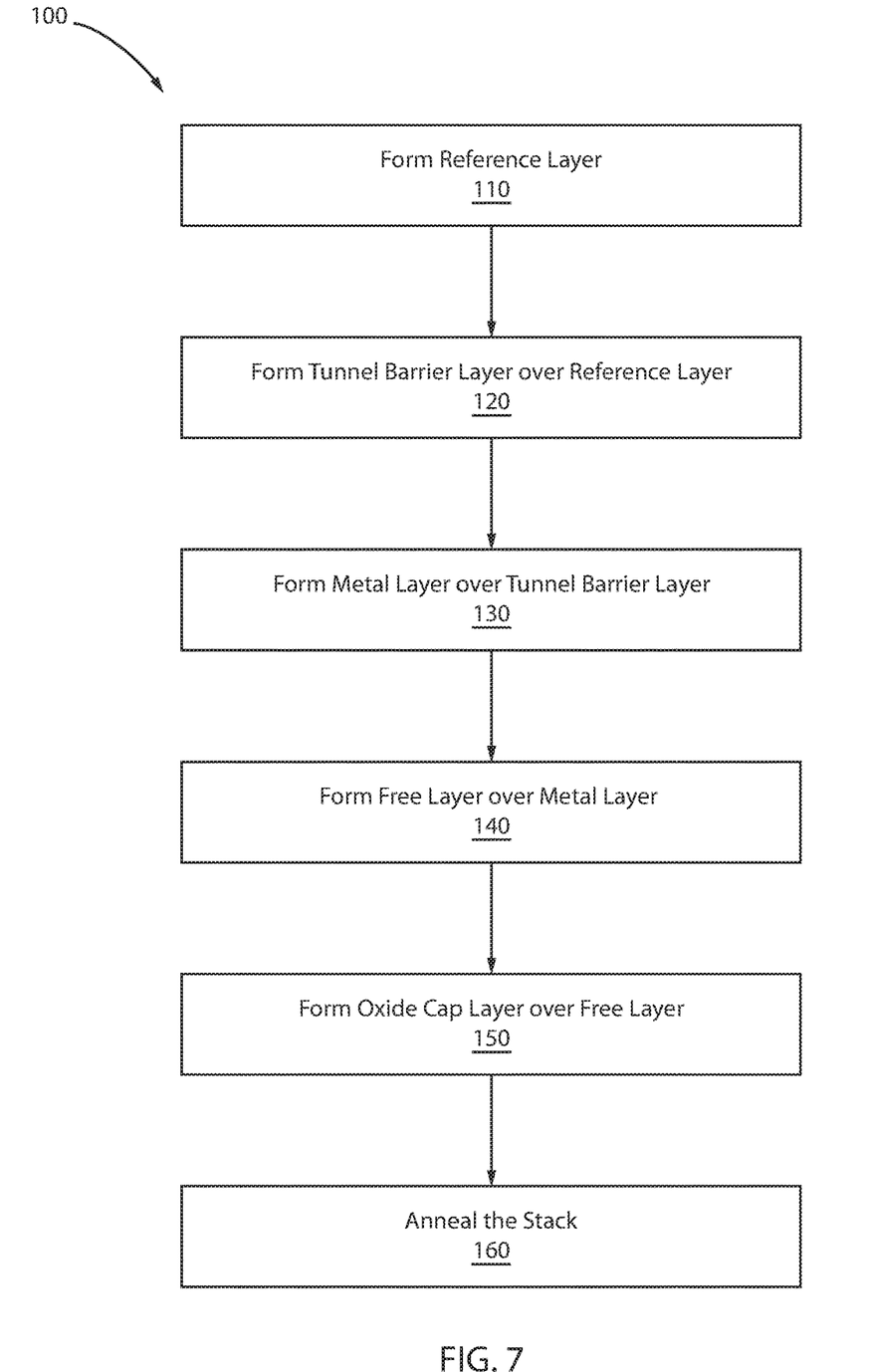
FIG. 7 is a block flow diagram depicted a process for making a MRAM device in accordance with an embodiment of the present principles.

Referring to FIG. 7, a block flow diagram depicting a method 100 of forming a MRAM device is accordance with an embodiment of the present principles is shown. In some alternative embodiments, the items noted in the blocks may occur out of the order given in the flow diagram. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 110, a reference layer is formed. The reference layer may be composed of any magnetic material that can have a magnetic direction that can be fixed, e.g., to provide a fixed or pinned magnetic direction for use in the reference layer of a memory device, e.g., STT MRAM device. In some examples, the reference layer may be a single layer region that is constructed of a metal or metal alloy of the metal materials indicated above. In another embodiment, the reference layer may be a multilayer arrangement comprising (1) a high spin polarization region comprised of a metal and/or metal alloy of the above-described metal materials, and (2) a region constructed of a material or materials that exhibit strong perpendicular magnetic anisotropy. In one embodiment, combinations of these materials and regions may also be employed. In another embodiment, a spacer layer may be formed between the metal/metal alloy region and the strong perpendicular magnetic anisotropy region. In some embodiments, the reference layer may have a thickness ranging from about 15 Å to about 200 Å.

In block 120, a tunnel barrier layer is formed over the reference layer. The tunnel barrier layer 15 may be composed of one or more metal oxides. For example, the metal oxides may be MgO, $Al_2O_3$, and $TiO_2$. The tunnel barrier layer may be formed, for example, by depositing MgO by RF sputtering employing a MgO target or by depositing a Mg layer and then oxidizing same, e.g., by natural oxidation or radical oxidation. The thickness of the tunnel barrier layer may be about 5 Å to about 20 Å.

In block 130, a metal layer is formed over the tunnel barrier layer. Metal layer may be composed of one or metals, including alkaline earth metals, e.g., magnesium (Mg) and calcium (Ca), transition metals, e.g., titanium, (Ti), and vanadium (V), or post-transition metals, e.g., aluminum (Al). The one or more metals may be arranged as layers or may in the form of an alloy of one or more of the metals. Metal layer may have a thickness in the range of about 1 Å to about 10 Å, and may be formed by DC sputtering a metal layer over the tunnel barrier layer.

In block 140, a free layer is formed over the metal layer. The free layer may be composed of one or more metals or alloys thereof. For example, the composition of free layer may be Co, Fe, an alloy of CoFe, Ni, an alloy of NiFe, or an alloy of CoFeB. The free layer may be formed using a deposition process, such as physical vapor deposition (PVD), which can include sputtering (e.g., DC sputtering, plasma enhanced chemical vapor deposition (PECVD), metal organic chemical vapor deposition (MOCVD) and combinations thereof. The free layer may have a thickness ranging from about 7 Å to about 10 Å.

In block 150, an oxide cap layer is formed over the free layer. The composition of oxide cap layer may be one or more metal oxides, e.g., oxides of aluminum, oxides of magnesium, oxides of magnesium and titanium, oxides of magnesium and tantalum, oxides of titanium, oxides of tantalum, oxides of tungsten, oxides of iridium and oxides of ruthenium, among others. The oxide cap layer may have a thickness in the range of about 2 Å to about 15 Å. The oxide cap layer may be formed by a deposition technique such as by RF sputtering employing a metal oxide target or by depositing a metal layer and then oxidizing same, e.g., by thermal oxidation.

In block 160, the stack is subjected to an annealing process. In some embodiments, the annealing may occur at a temperature ranging from about 300° C. to about 400° C. Annealing can occur for a time period ranging from about 5 minutes to about 90 minutes. In some embodiments, the anneal step 5 may range from about 10 minutes to about 60 minutes.

Figure 8:
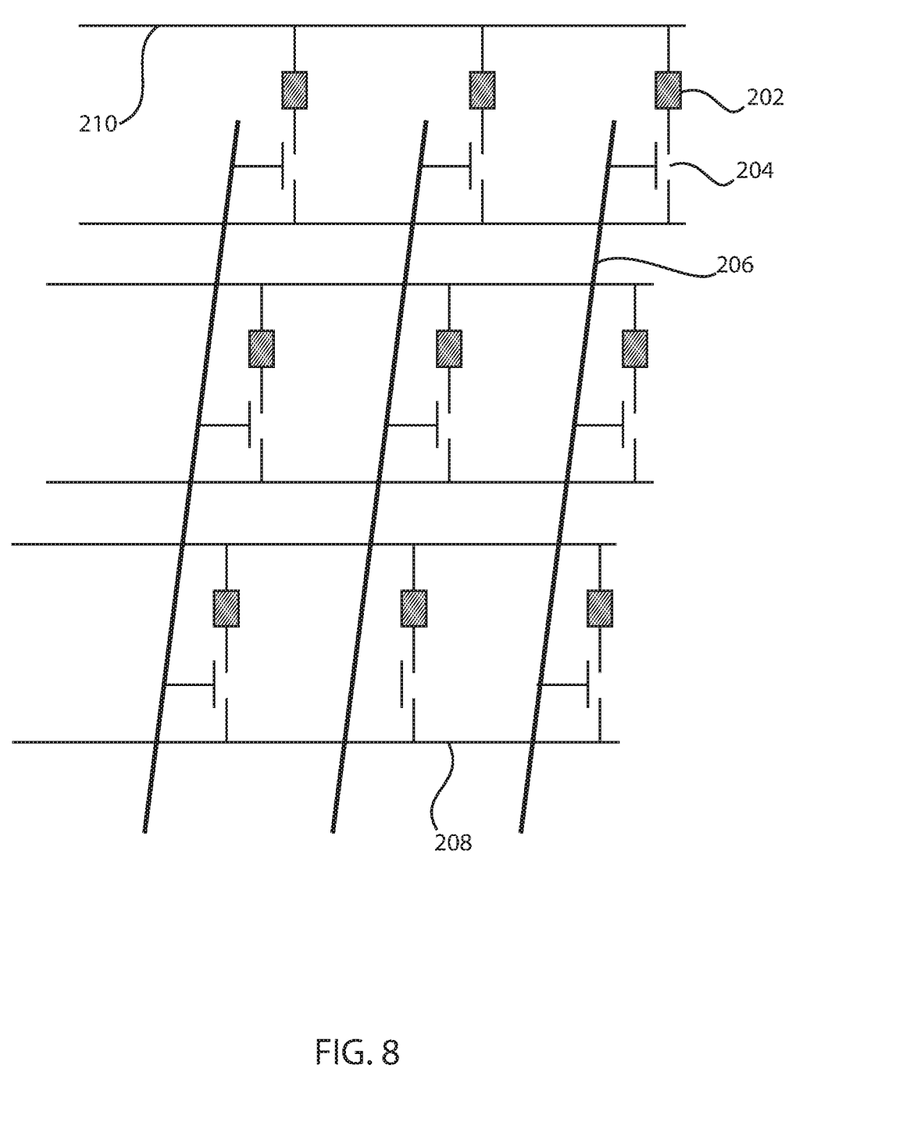
FIG. 8 is a perspective view of an array of MRAM devices implemented on a chip in accordance with an embodiment of the present principles.

Referring now to FIG. 8, an array of MRAM devices is shown. Each MRAM device 202 is connected to a respective transistor 204 that controls reading and writing. A word line 206 provides data to write to the devices 202, while a bit line 210 and a bit line complement 208 read data from the devices 202. In this manner, a large array of memory devices can be implemented on a single chip. An arbitrarily large number of MRAM devices can be employed, within the limits of the manufacturing processes and design specifications.

The embodiments in accordance with an embodiment of the present principles that are described herein provide specific advantages. As described, the thickness of the free layer is thinned considerably, e.g., from about 15 Å to about 20 Å to about 7 Å to about 10 Å, effectively reducing the magnetic moment of the free layer, which may be due to the formation and presence of the metal layer over the tunnel barrier layer. Thus the switching current needed to switch the polarity of the free layer is substantially reduced and fast switching in the free layer is facilitated. Furthermore, it is found that even with reducing the free layer thickness, strong PMA and strong magnetic exchange coupling are maintained by the device. Thus, what is described is an effective, functional MRAM device that is operative at a reduced switching current.

The methods and structures that have been described may be employed in any electrical device. For example, the memory devices that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

It should be further understood that STT MRAM devices according to embodiments of the present principles can be employed in any computing apparatus that utilizes RAM. For example, such computing apparatuses can utilize the STT MRAM devices in lieu of or in addition to RAM. Such computing apparatuses can include personal computers, mainframes, laptops, smart phones, tablet computers and other computing devices.

Having described preferred embodiments of STT MRAM devices, apparatuses and manufacturing methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A magnetoresistive random access memory device for storing at least one bit of information, the device comprising:

a reference layer of a magnetic material having a fixed magnetic polarity formed directly on an electrode;
an oxide tunnel barrier layer formed directly on the reference layer;
a non-oxide metal layer formed directly on the tunnel barrier layer, the metal layer being non-programmable and distinct from a non-uniform free layer;
the non-uniform free layer of a magnetic material having a changeable magnetic polarity formed directly on the metal layer, wherein the metal layer is interposed between the free layer and the tunnel barrier layer, the metal layer selected to reduce formation of free layer islands at thicknesses less than about 10 Å; and
a cap layer formed over the free layer.

2. The device of claim 1, wherein the free layer has a thickness of about 7 Å to about 10 Å.

3. The device of claim 1, wherein the free layer is present directly on top of the metal layer and has a thickness of about 7 Å to about 10 Å.

4. The device of claim 1, wherein the reference layer is comprised of a metal selected from the group consisting of iron, nickel, cobalt, chromium, boron, manganese, platinum, palladium, ruthenium, tantalum, tungsten, copper and alloys thereof.

5. The device of claim 1, wherein the reference layer is comprised of a multilayer arrangement comprising a region comprising a metal selected from the group consisting of iron, nickel, cobalt, chromium, boron, manganese, platinum, palladium, ruthenium, tantalum, tungsten, copper and alloys thereof and a region comprised of a metal selected from cobalt, nickel, platinum, palladium, iridium, ruthenium, an alloy of cobalt-iron-terbium, an alloy of cobalt-iron-gadolinium, an alloy of cobalt-chromium platinum, an alloy of cobalt-platinum, an alloy of cobalt-palladium, an ally of iron-platinum and an alloy of iron-palladium.

6. The device of claim 1, wherein the tunnel barrier layer comprises a metal oxide material selected from the group consisting of magnesium oxide, aluminum oxide and titanium oxide.

7. The device of claim 1, wherein the free layer comprises a material selected from the group consisting of cobalt, iron, an alloy of cobalt-iron, nickel, an alloy of nickel-iron and an alloy of cobalt-iron-boron.

8. The device of claim 1, wherein the metal layer comprises a material selected from the group consisting of aluminum, magnesium, calcium, vanadium and titanium.

9. The device of claim 1, wherein the cap layer is comprised of a material selected from the group consisting of oxides of aluminum, oxides of magnesium, oxides of magnesium and titanium, oxides of magnesium and tantalum, oxides of titanium, oxides of tantalum, oxides of tungsten, oxides of iridium and oxides of ruthenium.

10. The device of claim 1, wherein the reference layer is comprised of a metal region, a magnetic anisotropy region, and a spacer layer disposed between the metal region and the magnetic anisotropy region.

11. The device of claim 10, wherein the spacer layer comprises a material selected from the group consisting of tungsten, tantalum, and copper.

12. A magnetoresistive random access memory device for storing at least one bit of information, the device comprising:
a reference layer comprised of a magnetic material, the reference layer having a fixed magnetic polarity and formed directly on an electrode;
an oxide tunnel barrier layer formed directly on the reference layer;
a non-oxide metal layer formed directly on the tunnel barrier layer, the metal layer being non-programmable and distinct from a non-uniform free layer;
the non-uniform free layer of a magnetic material having a changeable magnetic polarity formed directly on the metal layer, wherein the metal layer is interposed between the free layer and the tunnel barrier layer, the metal layer selected to reduce formation of free layer islands at thicknesses less than about 10 Å; and
a cap layer formed over the free layer.

13. The device of claim 12, wherein the free layer has a thickness of about 8 Å or less.

14. The device of claim 12, wherein the reference layer is comprised of a region comprising a metal selected from the group consisting of iron, nickel, cobalt, chromium, boron, manganese, platinum, palladium, ruthenium, tantalum, tungsten, copper and alloys thereof and a region comprising a metal selected from cobalt, nickel, platinum, palladium, iridium, ruthenium, an alloy of cobalt-iron-terbium, an alloy of cobalt-iron-gadolinium, an alloy of cobalt-chromium platinum, an alloy of cobalt-platinum, an alloy of cobalt-palladium, an ally of iron-platinum and an alloy of iron-palladium.

15. The device of claim 12, wherein the tunnel barrier layer comprises a metal oxide material selected from the group consisting of magnesium oxide, aluminum oxide and titanium oxide.

16. The device of claim 12, wherein the free layer comprises a material selected from the group consisting of cobalt, iron, an alloy of cobalt-iron, nickel, an alloy of nickel-iron and an alloy of cobalt-iron-boron.

17. The device of claim 12, wherein the metal layer comprises a material selected from the group consisting of aluminum, magnesium, calcium, vanadium and titanium.

18. The device of claim 12, wherein the cap layer is comprised of a material selected from the group consisting of oxides of aluminum, oxides of magnesium, oxides of magnesium and titanium, oxides of magnesium and tantalum, oxides of titanium, oxides of tantalum, oxides of tungsten, oxides of iridium and oxides of ruthenium.

19. A method for forming a magnetoresistive random access memory device for storing at least one bit of information, the method comprising:
forming an oxide tunnel barrier layer directly on a reference layer, the reference layer comprised of a magnetic material with a fixed magnetic polarity and formed directly on an electrode;
forming a non-oxide metal layer directly on the tunnel barrier layer, the metal layer being non-programmable and distinct from a non-uniform free layer;
forming the non-uniform free layer of a magnetic material having a changeable magnetic polarity directly on the metal layer, wherein the metal layer is interposed between the free layer and the tunnel barrier layer, the metal layer selected to reduce formation of free layer islands at thicknesses less than about 10 Å;
forming a cap layer over the free layer; and
annealing the device structure.

20. The method of claim 19, wherein the metal layer is formed directly over the tunnel barrier layer.

* * * * *